United States Patent
Asfaw et al.

(10) Patent No.: US 10,887,713 B1
(45) Date of Patent: Jan. 5, 2021

(54) MICROPHONE DEFECT DETECTION

(71) Applicant: Facebook, Inc., Menlo Park, CA (US)

(72) Inventors: Michael Asfaw, Foster City, CA (US); Shaji Parol, San Jose, CA (US); Eric Roy Pedersen, Foster City, CA (US)

(73) Assignee: Facebook, Inc., Menlo Park, CA (US)

( * ) Notice: Subject to any disclaimer, the term of this patent is extended or adjusted under 35 U.S.C. 154(b) by 0 days.

(21) Appl. No.: 16/711,069

(22) Filed: Dec. 11, 2019

(51) Int. Cl.
*H04R 29/00* (2006.01)
*H04R 25/00* (2006.01)
*G01R 31/28* (2006.01)

(52) U.S. Cl.
CPC ........... *H04R 29/005* (2013.01); *G01R 31/28* (2013.01); *H04R 25/305* (2013.01)

(58) Field of Classification Search
None
See application file for complete search history.

(56) References Cited

U.S. PATENT DOCUMENTS

| | | | | |
|---|---|---|---|---|
| 4,065,647 A * | 12/1977 | Frye | .................. | G01H 3/00 381/60 |
| 2005/0013444 A1 * | 1/2005 | Dorfman | .............. | H04R 29/001 381/58 |
| 2012/0045068 A1 * | 2/2012 | Kim | ..................... | H04R 29/005 381/58 |
| 2014/0076052 A1 * | 3/2014 | Doller | ................. | B81C 99/0045 73/587 |
| 2017/0289717 A1 * | 10/2017 | Little | ..................... | G06F 3/165 |

OTHER PUBLICATIONS

Xu, Zhou, et al. "MICHAC: Defect Prediction via Feature Selection based on Maximal Information Coefficient with Hierarchical Agglomerative Clustering." 2016 IEEE 23rd International Conference on Software Analysis, Evolution, and Reengineering, 2016, pp. 370-381. (Year: 2016).*
Klippel, Wolfgang. "End-Of-Line Testing." Assembly Line—Theory and Practice, Aug. 17, 2011, pp. 181-206. (Year: 2011).*
"Human Auditory Range." Cochlea.org, edited by Remy Pujol, Jun. 6, 2018, www.cochlea.org/en/hear/human-auditory-range. (Year: 2018).*
"Let's Clear Up Some Things About Sweeps . . . " NTi Audio, Nov. 13, 2017, www.nti-audio.com/en/news/lets-clear-up-some-things-about-sweeps-part-1-of-2. (Year: 2017).*

* cited by examiner

*Primary Examiner* — James K Mooney
(74) *Attorney, Agent, or Firm* — Fenwick & West LLP

(57) ABSTRACT

Disclosed are an apparatus and method for testing a microphone of a device under test. The apparatus includes a speaker, a mount or bracket that secures a device under test a fixed distance from the speaker, and a controller. The controller causes the speaker to generate a test signal at various amplitudes. The controller receives an output signal generated by the microphone in response to the test signal and generates a prediction of whether the microphone is defective based on the output signal. The prediction may be generated by a machine-learning model such as a neural network or other trained classifier.

16 Claims, 5 Drawing Sheets

MICROPHONE DEFECT DETECTION

BACKGROUND

1. Technical Field

The subject matter described generally relates to component testing and, in particular, to identifying defective MEMS microphones.

2. Background Information

Many devices include microphones. In particular, microphones that are microelectromechanical systems (MEMS microphones) are commonly used in laptops, smartphones, smart speakers, tablets, and other portable electronic devices. During the manufacturing process, flux and other contaminants may enter the microphone port. These contaminants may interfere with the proper operation of the microphone, resulting in defective performance. However, such defects are difficult to detect using existing testing techniques. This may lead to increased expense and customer frustration, as microphones may need to be replaced after purchase of the electronic device.

SUMMARY

The above and other problems may be addressed by a microphone testing apparatus and corresponding method. A microphone is placed in a test environment and exposed to a test signal with a known frequency profile at various amplitudes. For example, the amplitude of the test signal may be swept from a lower threshold to an upper threshold. Features are extracted from the output of the microphone at different amplitudes of the test signal and the extracted features are provided to a defect prediction model (e.g., a trained neural network or other machine-learning classifier). The defect prediction model outputs a prediction of whether the microphone is defective.

DETAILED DESCRIPTION

Reference will now be made to several embodiments, examples of which are illustrated in the accompanying figures. It is noted that wherever practicable similar or like reference numbers are used in the figures to indicate similar or like functionality. One skilled in the art may recognize from the following description that alternative embodiments of the structures and methods may be employed without departing from the principles described.

Example Test Apparatus

Figure 1:
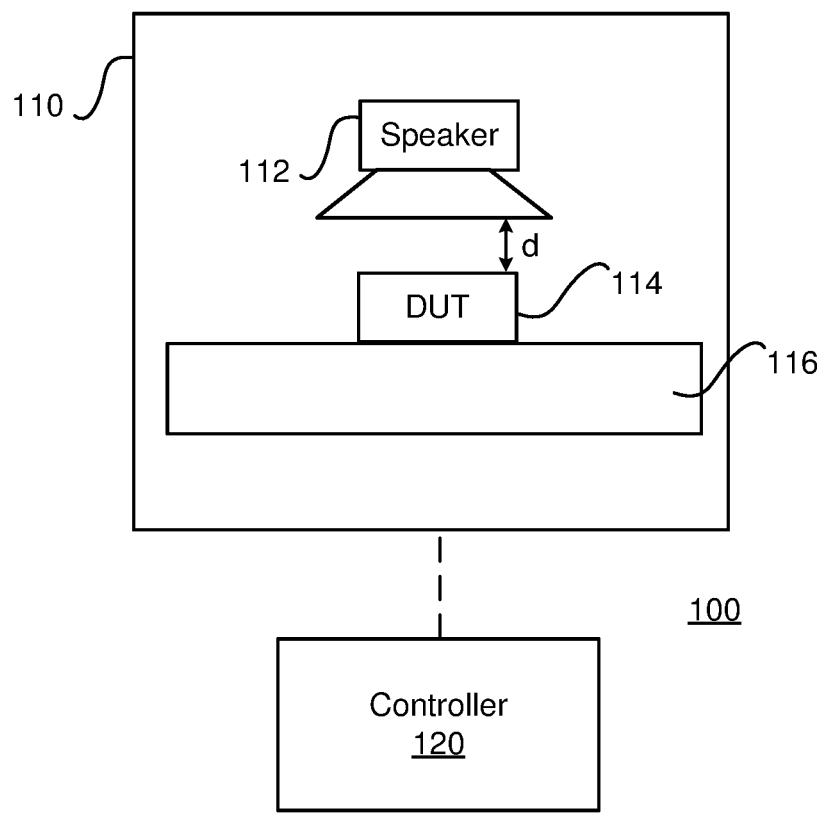
FIG. 1 illustrates a microphone test apparatus, according to one embodiment.

FIG. 1 illustrates one embodiment of a microphone test apparatus 100. In the embodiment shown, the apparatus 100 includes a test environment 110 and a controller 120. A speaker 112 and a device under test 114 are located within the test environment 110. The device under test 114 is secured by a mount or bracket 116. In other embodiments, the microphone test apparatus 100 may include different or additional elements. In addition, the functions may be distributed among the elements in a different manner than described.

The test environment 110 provides a stable acoustic environment such that test results for different microphones can be directly compared. In one embodiment, the test environment 110 is an anechoic box. The speaker 112 is located a predetermined distance (e.g., between one and fifty centimeters) from the device under test 114. For example, the test environment may include brackets or other mountings (e.g., mounting 116) to provide consistent positioning of the device under test 114 relative to the speaker 112.

The controller 120 is a computing device that controls the testing performed by the apparatus 100. The controller 120 may be a desktop computer, laptop computer, tablet, smartphone, or any other device capable of controlling the speaker 112 and processing the output from one or microphones of the device under test 114 to identify defective microphones. The controller 120 sends a drive signal to the speaker 112 (or an amplifier connected to the speaker if it is not powered) via a wired or wireless connection. Alternatively, the controller 120 may be software executing on the device under test 114.

The drive signal generated by the controller 120 causes the speaker 112 to produce sound waves with a constant frequency profile at a range of different amplitudes. In one embodiment, the speaker 120 produces a sine wave with a fixed frequency and sweeps the amplitude from a lower threshold to an upper threshold in a predetermined number of steps. For example, the fixed frequency may be 1 kHz and the amplitude may be swept from 94 dBSPL to 135 dBSPL in 300 steps. These parameters are suitable for testing microphones used to record human speech because the frequency spectrum of typical voices includes significant components around 1 kHz and the amplitude range stresses the microphone. Furthermore, this range corresponds to the typical sound amplitude resulting from feedback of an internal speaker or woofer located close to the microphone, in some embodiments. In addition, defective and non-defective microphones output different signals in this range. At lower amplitudes, the sound waves may not sufficiently move any contaminant particles in the microphone to have a detectable impact on the output.

To test microphones with different use cases, different parameters may be used. For example, microphones intended for recording bat calls might use a higher fixed frequency. In other embodiments, or a range of frequencies may be used, with either a fixed amplitude or a range of amplitudes.

The device under test 114 is an electronic device that includes one or more microphones to be tested. In one embodiment, the microphones are MEMS microphones. The device under test 114 records the output from the microphone(s) in response to the sound waves produced by the speaker 112 and sends them to the controller via a wired or wireless connection. The controller 120 analyzes the output to identify defective microphones. Various embodiments of the controller 120 are described in greater detail below, with reference to FIG. 4.

Example Device

Figure 2:
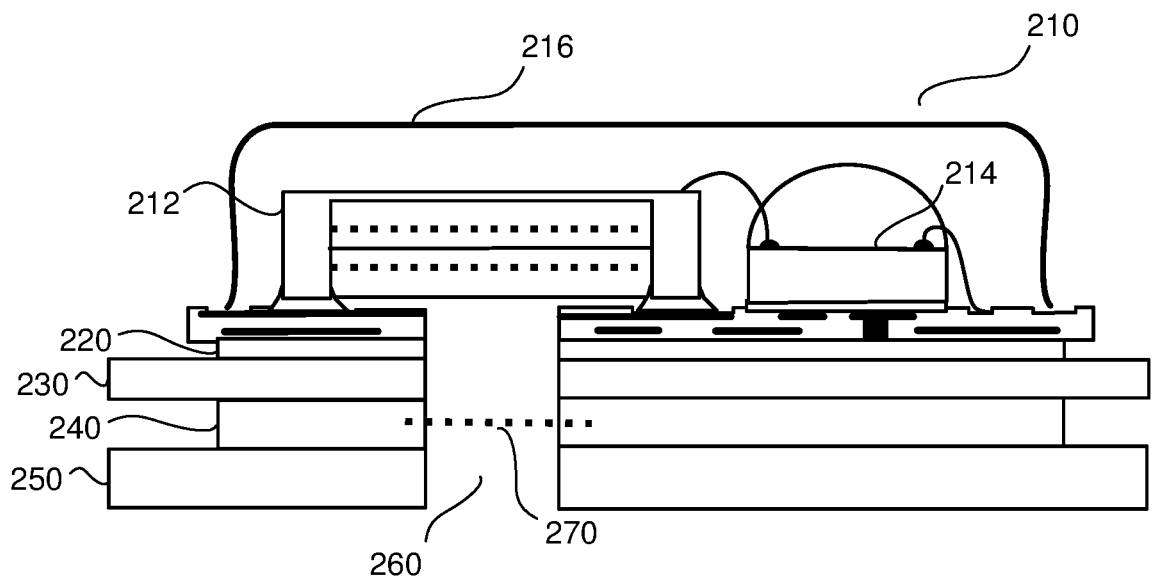
FIG. 2 illustrates a portion of the device under test in FIG. 1, according to one embodiment.

FIG. 2 illustrates a portion of one embodiment of a device under test 114. In the embodiment shown, the device under test 114 includes a MEMS microphone 210 connected to a printed circuit board (PCB) 230 with a layer of solder 220. The PCB 230 is attached to the enclosure 250 of the device under test 114 by an adhesive layer 240.

The MEMs microphone 210 includes a transducer 212 and an application-specific integrated circuit (ASIC) 214 covered by a metal lid 216. The metal lid 216 creates a back volume and shields the ASIC 214 from radio frequency (RF) signals that may otherwise generate interference. Sound waves reach the transducer 212 through a gap 260 in the enclosure 250. The gap 260 may include a mesh 270, secured by the adhesive 240, to prevent large objects from passing through the gap and damaging or otherwise disrupting operation of the transducer 212.

Figure 3:
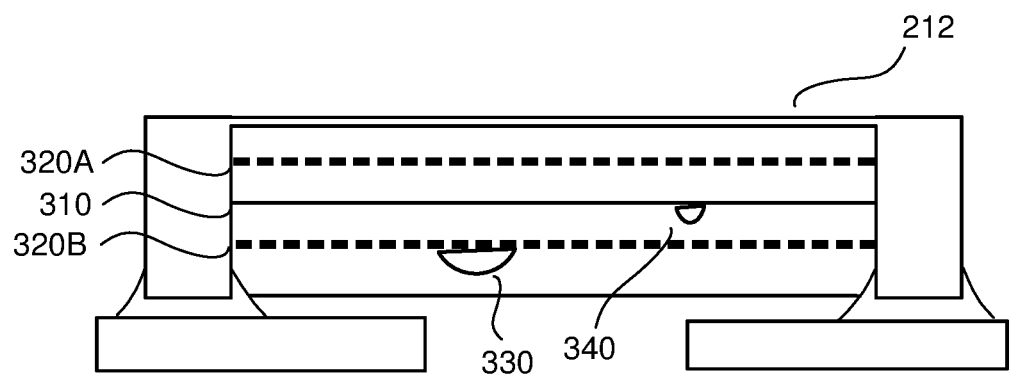
FIG. 3 illustrates the MEMS microphone of FIG. 2, according to one embodiment.

FIG. 3 illustrates one embodiment of the transducer 212 in greater detail. In the embodiment shown, the transducer 212 includes a flexible membrane 310 between a pair of plates 320. At least the bottom plate 320B is perforated to enable sound waves to pass though and cause the membrane 310 to vibrate. The membrane 310 and the top plate 320A form a capacitor. Similarly, the flexible membrane 310 and the bottom plate 320B also form a capacitor. In another embodiment, the transducer 212 has a single plate 320. In operation, the ASIC 214 generates a fixed charge on the membrane 310 and measures the voltage variations that result from changes in capacitance as the membrane oscillates in response to sound waves while the plate(s) 320 remain substantially static.

During manufacture, pieces of solder or other debris may get inside the transducer 212. This debris can interfere with the operation of the transducer 212. In some cases, the interference may be significant enough to consider the MEMS microphone 210 defective. For example, FIG. 3 shows a large piece of debris 330 and a smaller piece of debris 340. The large piece of debris 330 has settled on the bottom plate 320B because it cannot fit through the perforations in bottom plate. As the bottom plate 320B remains substantially static during operation, the large piece of debris 330 does not have a significant impact on the operation of the transducer 212. In contrast, the smaller piece of debris 340 has passed through the perforations in the bottom plate 320B and settled on the membrane 310. Consequently, the smaller piece of debris 340 may interfere with the vibration of the membrane 310 and thereby alter the output of the transducer 212 in response to sound waves. As a result, the smaller piece of debris 340 may render the microphone 210 defective if the effect on the transducer output 212 is significant.

Example Controller

Figure 4:
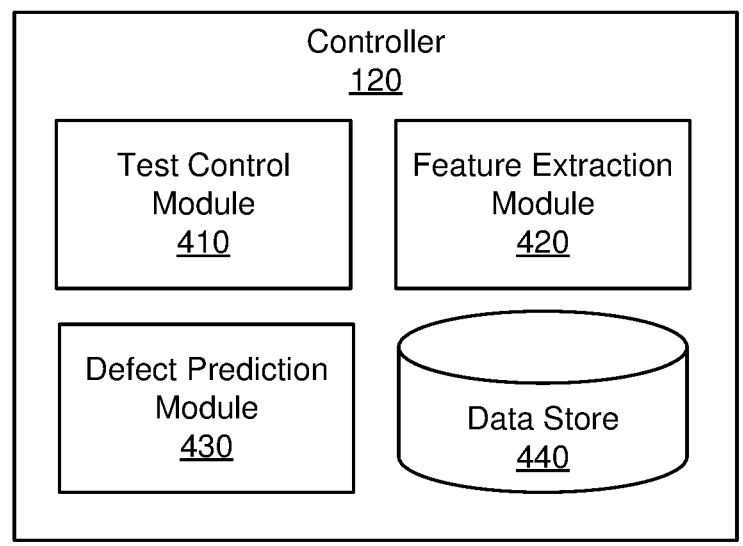
FIG. 4 illustrates the controller shown in FIG. 1, according to one embodiment.

FIG. 4 illustrates one embodiment of the controller 120. In the embodiment shown, the controller 120 includes a test control module 410, a feature extraction module 420, a defect prediction module 430, and a data store 440. In other embodiments, controller 120 may include different or additional elements. In addition, the functions may be distributed among the elements in a different manner than described.

The test control module 410 generates a drive signal that causes the speaker 112 to produce the desired sound waves. In one embodiment, the test control module 410 generates a sine wave at a fixed frequency (e.g., 1 kHz) and sends it to an amplifier that drives the speaker 112. Alternatively, other waveforms may be used, such as square waves, triangle waves, or sawtooth waves, etc. The test control module 410 also generates an amplitude control signal that causes the amplifier to alter the amount of amplification applied to the drive signal. For example, the amplitude control signal may modify the amount of amplification over time such that the amplitude of the sound waves generated by the speaker 112 sweep from a lower threshold (e.g., 94 dBSPL) to an upper threshold (e.g., 135 dBSPL). The amplitude may increase in a predetermined number of steps (e.g., 300) such that there are a discrete set of amplitudes. The steps may be evenly spaced. Alternatively, the steps may be uneven (e.g., such that there are a greater number of different amplitudes generated in a portion of the range that is expected to include features that may distinguish between defective and non-defective microphones).

The feature extraction module 420 receives and processes the output from one or more microphones 210 of the device under test 114 in response to the sound waves generated by the speaker 112. In one embodiment, the feature extraction module 420 calculates a total harmonic distortion profile for each microphone 210. The profile includes a total harmonic distortion percentage for the output of the microphone 210 at each amplitude step of the sound waves generated by the speaker 112. The total harmonic distortion value for a step represents a percentage of the microphone's output corresponding to overtones generated by harmonic distortion rather than the fundamental frequency generated by the speaker 112. For example, in the case where the speaker 212 generates a 1 kHz sine wave for which the amplitude is swept from 94 dBSPL to 135 dBSPL in 300 steps, the features include 300 total harmonic distortion values, one for each step. The total harmonic distortion profile may be represented as a feature vector with the total harmonic distortion values stored in a specified order. In some embodiments, the feature vector may include different or additional features derived from the output of a microphone 210. For example, the overall output level of the microphone in response to each amplitude may be used instead of or in addition to the total harmonic distortion profile.

The defect prediction module 430 provides the extracted feature vector as input to a model. The model outputs predictions of whether the corresponding microphone 210 is defective or non-defective. In one embodiment, the model is supervised machine-learning model such as a neural network or random forest classifier. Alternatively, an unsupervised clustering algorithm may be used, such as k-means or Gaussian mixture model clustering.

In this case of supervised learning, the model is initially trained using a set of microphones 210 that includes both defective and non-defective microphones. The status of each microphone 210 as defective or non-defective is determined using an alternative method that is known to be accurate (e.g., visual inspection with a microscope, manual inspection of frequency response curves, etc.). The microphones 210 in the training set are tested using the microphone test apparatus 100 and the feature vectors extracted from their responses to the sound waves generated by the speaker 212 are provided to the model to generate predictions as to whether the microphones 210 are defective or non-defective. The model is updated based on discrepancies between the predictions and the known statuses of the microphones 210 (e.g., using backpropagation). The model is iteratively updated using this process until a threshold condition is met, such as the accuracy of the model exceeding a target accuracy threshold (e.g., 95% of predictions matching the known status of the microphone 210). The model may also be validated using a validation set of microphones with known statuses.

In the case where unsupervised learning is used, a batch of microphones 210 is tested together. The feature vectors for each microphone 210 are provided as input to a clustering model that divides the batch into two or more clusters by attempting to minimize the difference between feature vectors for microphones 210 in the same cluster. The defect prediction module 440 my then use a set of rules to determine which cluster corresponds to non-defective microphones 210 and which cluster (or clusters) correspond to defective microphones.

Figure 5:
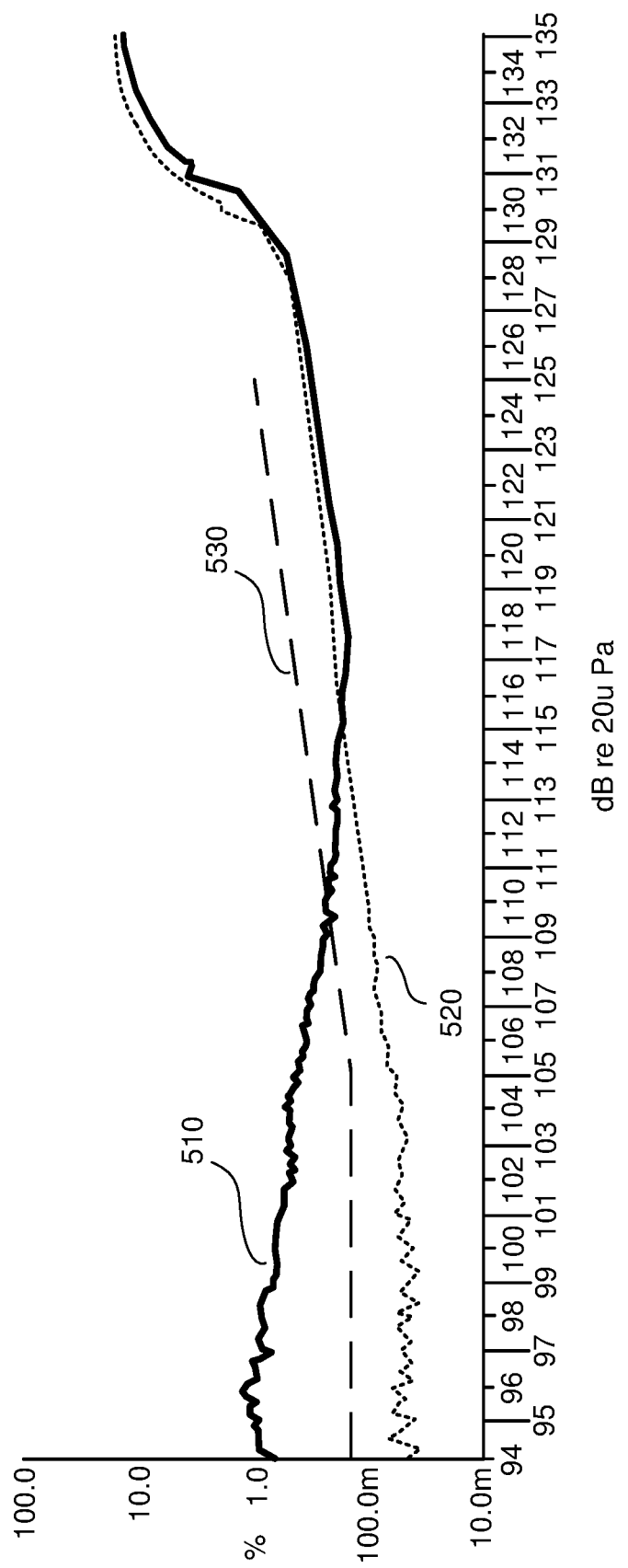
FIG. 5 illustrates the total harmonic distortion profile of microphone with a first defect type relative to a non-defective microphone.
Figure 6:
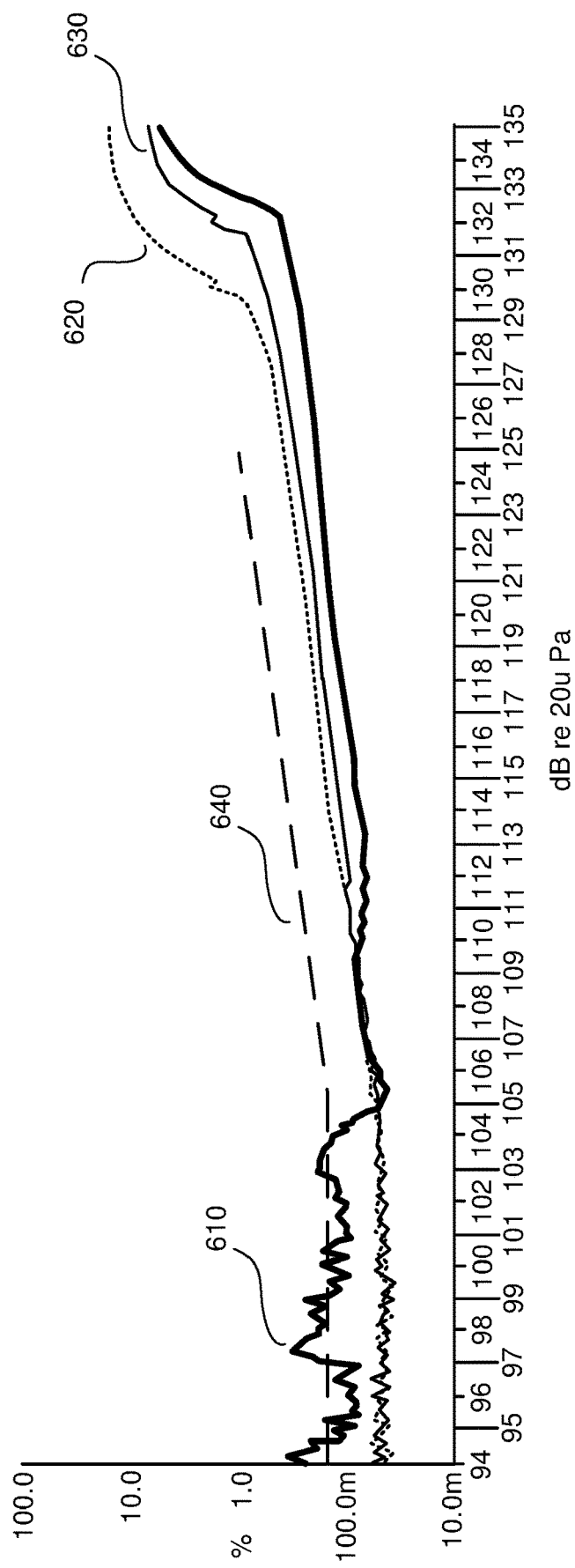
FIG. 6 illustrates the total harmonic distortion profile of a second type of defective microphone relative to a pair of non-defective microphones.

FIGS. 5 and 6 illustrate examples of how total harmonic distortion profiles can distinguish between defective and non-defective microphones 210. FIG. 5 includes a first total harmonic distortion profile 510 and a second total harmonic distortion profile 520. The first profile 510 corresponds to a microphone 210 with a first type of defect 510. The second profile 520 corresponds to a non-defective microphone 210. The profiles are substantially the same at higher amplitudes, but in the low amplitude region, the first profile 510 has significantly more harmonic distortion that the second profile 520. Line 530 in FIG. 5 illustrates boundary determined by the model that distinguishes between defective and non-defective microphones 210. If any part of a total harmonic distortion profile is above the line 530, the model predicts that the corresponding microphone 210 is defective.

Similarly, FIG. 6 includes a first total harmonic distortion profile 610 (corresponding to a microphone 210 with a second type of defect) and a second total harmonic distortion profile 620 (corresponding to a non-defective microphone). In addition to higher distortion at lower amplitudes, the first total harmonic distortion profile 610 also has lower distortion than the profile 620 corresponding to a non-defective microphone 210 at higher amplitudes. FIG. 6 also includes a third total harmonic distortion profile 630 for which it is not clear whether it corresponds to a defective microphone 210 or not. The third profile 630 exhibits reduced distortion at higher amplitudes, similar to the profile 610 of the defective microphone 210, but tracks the profile 620 of the non-defective microphone closely at lower amplitudes. In this case, the third profile 630 corresponds to a non-defective microphone 210 because no part of the profile is above the line 640.

Referring back to FIG. 4, regardless of the precise model used, the defect prediction module 430 outputs a prediction of whether each microphone 210 under test is defective or non-defective. The prediction may comprise a probability that the prediction is correct. In some embodiments, the prediction may also indicate a type of defect or include a set of probabilities indicating the likelihood that the microphone 210 has each of a set of possible defects. Thus, microphones 210 that are indicated as defective (or having more than a threshold probability of being defective) may be subject to further testing or discarded and replaced in the device 114. In some embodiments, the model may be retrained as more training data becomes available. For example, if the model predicts that a set of microphones 210 are defective but further testing reveal they are non-defective, these microphones may be added to the training data and the model retrained.

The data store 440 includes one or more non-transitory computer-readable media configured to store data or software. The data store 440 may store computer-executable instructions that, when executed by the controller cause the controller to test one or more microphones using the techniques described above. The data store 440 may also store the raw output from microphones 210, the total harmonic distortion profiles calculated by the feature extraction module 420, the models used by the defect prediction module 430, or any other data used or generated by the controller 120.

Example Method

Figure 7:
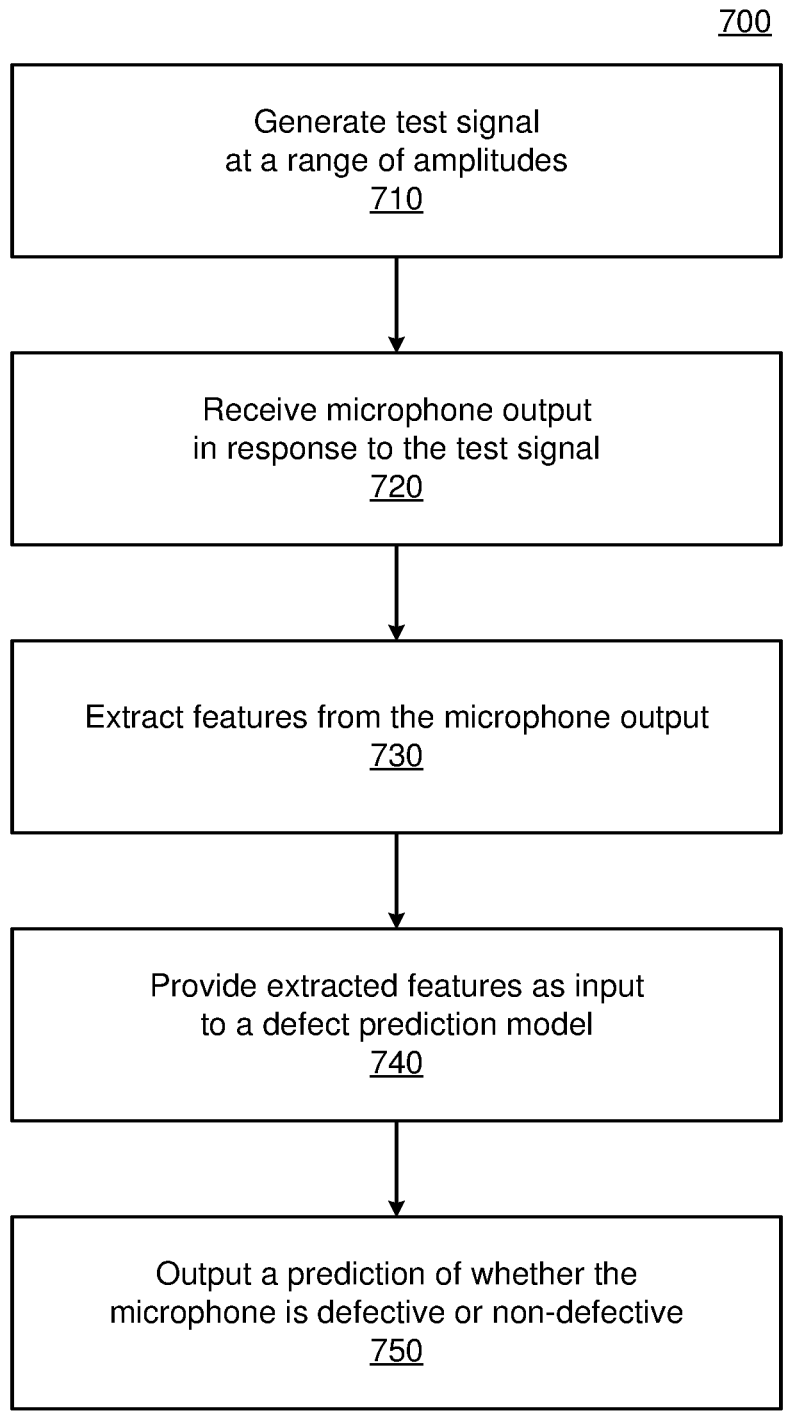
FIG. 7 illustrates a method for testing a microphone, according to one embodiment.

FIG. 7 illustrates a method 700 for testing a microphone 210, according to one embodiment. The steps of FIG. 7 are illustrated from the perspective of the controller 120 performing the method 700. However, some or all of the steps may be performed by other entities or components. In addition, some embodiments may perform the steps in parallel, perform the steps in different orders, or perform different steps.

In the embodiment shown in FIG. 7, the method 700 begins by generating 710 a test signal at a range of amplitudes. As described previously, the test signal may be a sine wave of fixed frequency and the range of amplitudes may be obtained by sweeping the amplitude from a lower threshold to an upper threshold in steps (or vice versa).

The controller 120 receives 720 the output generated by the microphone 210 in response to the test signal and extracts 730 features from the output of the microphone. The extracted 730 features may be a total harmonic distortion profile represented as a feature vector.

The controller 120 provides 740 the extracted features as input to a defect prediction model. The model outputs 750 a prediction of whether the microphone 20 is defective or non-defective. The prediction may include a probability that the microphone is defective. In some embodiments, the prediction may also indicate a type of defect or a probability that each of a set of possible defects are present in the microphone 120.

Additional Considerations

Some portions of above description describe the embodiments in terms of algorithmic processes or operations. These algorithmic descriptions and representations are commonly used by those skilled in the computing arts to convey the substance of their work effectively to others skilled in the art. These operations, while described functionally, computationally, or logically, are understood to be implemented by computer programs comprising instructions for execution by a processor or equivalent electrical circuits, microcode, or the like. Furthermore, it has also proven convenient at times, to refer to these arrangements of functional operations as modules, without loss of generality.

As used herein, any reference to "one embodiment" or "an embodiment" means that a particular element, feature, structure, or characteristic described in connection with the embodiment is included in at least one embodiment. The appearances of the phrase "in one embodiment" in various places in the specification are not necessarily all referring to the same embodiment. Similarly, use of "a" or "an" preceding an element or component is done merely for convenience. This description should be understood to mean that one or more of the element or component is present unless it is obvious that it is meant otherwise.

Where values are described as "approximate" or "substantially" (or their derivatives), such values should be construed as accurate +/−10% unless another meaning is apparent from the context. From example, "approximately ten" should be understood to mean "in a range from nine to eleven."

As used herein, the terms "comprises," "comprising," "includes," "including," "has," "having" or any other variation thereof, are intended to cover a non-exclusive inclusion.

For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Upon reading this disclosure, those of skill in the art will appreciate still additional alternative structural and functional designs for a system and a process for testing microphones. Thus, while particular embodiments and applications have been illustrated and described, it is to be understood that the described subject matter is not limited to the precise construction and components disclosed. The scope of protection should be limited only by the following claims.

What is claimed is:

1. A method of testing a microphone, the method comprising:
   generating a test signal at a constant frequency across a plurality of predetermined amplitudes, the plurality of predetermined amplitudes ranging from a first threshold amplitude to a second threshold amplitude;
   receiving an output signal generated by the microphone in response to the test signal;
   extracting a plurality of features from the output signal, the extracting comprising calculating a total harmonic distortion profile including a plurality of total harmonic distortion values, each total harmonic distortion value corresponding to one of the plurality of predetermined amplitudes, wherein the plurality of features include the plurality of total harmonic distortion values;
   generating a feature vector of the plurality of features;
   providing the feature vector of the plurality of features as input to a defect prediction model; and
   receiving, from the defect prediction model, a prediction of whether the microphone is defective.

2. The method of claim 1, wherein the test signal is a sine wave.

3. The method of claim 2, wherein the frequency of the test signal is in a range from 500 hertz to 2 kilohertz.

4. The method of claim 1, wherein the plurality of predetermined amplitudes increase in steps of equal amplitude from the first threshold amplitude to the second threshold amplitude.

5. The method of claim 1, wherein the defect prediction model is a trained supervised learning model.

6. A microphone testing apparatus comprising:
   a speaker;
   a mount or bracket configured to secure a device under test a fixed distance from the speaker; and
   a controller configured to:
      cause the speaker to generate a test signal at a constant frequency across a plurality of predetermined amplitudes, the plurality of predetermined amplitudes ranging from a first threshold amplitude to a second threshold amplitude;
      receive an output signal generated by a microphone of the device under test in response to the test signal; and
      generate a prediction of whether the microphone is defective based on the output signal by:
         extracting a plurality of features from the output signal, the extracting comprising calculating a total harmonic distortion profile including a plurality of total harmonic distortion values, each total harmonic distortion value corresponding to one of the plurality of predetermined amplitudes, wherein the plurality of features include the plurality of total harmonic distortion values,
         generating a feature vector of the plurality of features, and
         providing the feature vector of the plurality of features as input to a defect prediction model, the defect prediction model outputting the prediction of whether the microphone is defective.

7. The microphone testing apparatus of claim 6, wherein the speaker and the mount or bracket are within an anechoic box.

8. The microphone testing apparatus of claim 6, wherein the fixed distance is in a range from one centimeter to fifty centimeters.

9. The microphone testing apparatus of claim 6, wherein the controller is software executing on the device under test.

10. The microphone testing apparatus of claim 6, wherein the test signal is a sine wave of fixed frequency in a range from 500 hertz to 2 kilohertz.

11. The microphone testing apparatus of claim 6, wherein the defect prediction model is a clustering model.

12. The microphone testing apparatus of claim 6, wherein the plurality of predetermined amplitudes increase in steps of equal amplitude from the first threshold amplitude to the second threshold amplitude.

13. A non-transitory, computer-readable medium storing instructions that, when executed by a computing device, cause the computing device to perform operations comprising:
   generating a test signal at a plurality of amplitudes at a constant frequency across a plurality of predetermined amplitudes, the plurality of predetermined amplitudes ranging from a first threshold amplitude to a second threshold amplitude;
   receiving an output signal generated by the microphone in response to the test signal;
   extracting a plurality of features from the output signal, the extracting comprising calculating a total harmonic distortion profile including a plurality of total harmonic distortion values, each total harmonic distortion value corresponding to one of the plurality of predetermined amplitudes, wherein the plurality of features include the plurality of total harmonic distortion values;
   generating a feature vector of the plurality of features;
   providing the feature vector of the plurality of features as input to a defect prediction model; and
   receiving, from the defect prediction model, a prediction of whether the microphone is defective.

14. The non-transitory, computer-readable medium of claim 13, wherein the plurality of predetermined amplitudes increase in steps of equal amplitude from the first threshold amplitude to the second threshold amplitude.

15. The non-transitory, computer-readable medium of claim 13, wherein the test signal is a sine wave of fixed frequency in a range from 500 hertz to 2 kilohertz.

16. The non-transitory, computer-readable medium of claim 13, wherein the defect prediction model is a trained supervised learning model.

* * * * *